United States Patent
Lang

(10) Patent No.: US 9,985,321 B2
(45) Date of Patent: May 29, 2018

(54) BATTERY SYSTEM

(75) Inventor: Martin Lang, Hessigheim (DE)

(73) Assignees: Robert Bosch GmbH, Stuttgart (DE); Samsung, SDI Co., Ltd, Yongin-si, Gyeonggi-do (KR)

( * ) Notice: Subject to any disclaimer, the term of this patent is extended or adjusted under 35 U.S.C. 154(b) by 1054 days.

(21) Appl. No.: 14/352,366

(22) PCT Filed: Sep. 14, 2012

(86) PCT No.: PCT/EP2012/068047
§ 371 (c)(1),
(2), (4) Date: Aug. 6, 2014

(87) PCT Pub. No.: WO2013/056917
PCT Pub. Date: Apr. 25, 2013

(65) Prior Publication Data
US 2014/0349157 A1  Nov. 27, 2014

(30) Foreign Application Priority Data
Oct. 18, 2011 (DE) .......... 10 2011 084 688

(51) Int. Cl.
*H01M 10/42* (2006.01)
*B60L 11/18* (2006.01)
(Continued)

(52) U.S. Cl.
CPC ..... *H01M 10/4257* (2013.01); *B60L 11/1853* (2013.01); *B60L 11/1864* (2013.01);
(Continued)

(58) Field of Classification Search
None
See application file for complete search history.

(56) References Cited

U.S. PATENT DOCUMENTS

2002/0163339 A1   11/2002   Friel et al.
2008/0192399 A1*  8/2008   Chen .................. H01M 10/425
                                                              361/115
(Continued)

FOREIGN PATENT DOCUMENTS

DE   10 2010 030 818 A1   2/2011
DE   10 2010 030 747 A1   1/2012
(Continued)

OTHER PUBLICATIONS

International Search Report corresponding to PCT Application No. PCT/EP2012/068047, dated Dec. 18, 2012 (German and English language document) (7 pages).

*Primary Examiner* — Rena Dye Cronin
(74) *Attorney, Agent, or Firm* — Maginot, Moore & Beck LLP

(57) ABSTRACT

A battery system includes a plurality of battery cells and a battery management unit. The battery management unit comprises a plurality of acquisition devices and a plurality of monitoring devices. Each of the acquisition devices is configured to acquire at least one operating parameter of the battery cells associated therewith. Each of the monitoring devices is associated with a plurality of battery cells, and each of the monitoring devices is configured to monitor the operating parameter of the battery cells associated therewith. The battery cells, which are each associated with one of the monitoring devices, are associated with at least two acquisition devices.

8 Claims, 4 Drawing Sheets

(51) Int. Cl.
    *G01R 31/36*     (2006.01)
    *H01M 10/48*     (2006.01)

(52) U.S. Cl.
    CPC ....... *H01M 10/425* (2013.01); *H01M 10/482* (2013.01); *G01R 31/362* (2013.01); *G01R 31/3658* (2013.01); *H01M 2220/20* (2013.01); *Y02T 10/7005* (2013.01); *Y02T 10/7061* (2013.01)

(56) References Cited

U.S. PATENT DOCUMENTS

| | | | |
|---|---|---|---|
| 2009/0208821 A1 | 8/2009 | Kosugi et al. | |
| 2009/0263705 A1 | 10/2009 | Anantharaman | |
| 2013/0207464 A1* | 8/2013 | Kluthe | H01M 10/44 307/10.7 |
| 2013/0249317 A1* | 9/2013 | Kang | G01R 31/3658 307/116 |

FOREIGN PATENT DOCUMENTS

| | | | |
|---|---|---|---|
| WO | 99/27628 A1 | 6/1999 | |
| WO | 2012/000709 | * 1/2012 | ............. G01R 31/36 |

* cited by examiner

BATTERY SYSTEM

This application is a 35 U.S.C. § 371 National Stage Application of PCT/EP2012/068047, filed on Sep. 14, 2012, which claims the benefit of priority to Serial No. DE 10 2011 084 688.3, filed on Oct. 18, 2011 in Germany, the disclosures of which are incorporated herein by reference in their entirety.

The present disclosure relates to a battery system and to a motor vehicle having the battery system according to the disclosure.

BACKGROUND

It would appear that, in future, new battery systems will increasingly be used both in stationary applications (for example in wind power installations) and in vehicles (for example in hybrid and electric vehicles), with very stringent requirements being placed on said battery systems in respect of reliability.

The background to said stringent requirements is that failure of the battery can result in failure of the entire system. By way of example, in the case of an electric vehicle, failure of the traction battery leads to a so-called "breakdown". Furthermore, the failure of the battery can result in a safety-related problem. In wind power installations, for example, batteries are used in order to protect the installation from impermissible operating states in a high wind by virtue of rotor blade adjustment.

The block diagram for a battery system in accordance with the current prior art is illustrated in FIG. 1. A battery system, denoted as a whole by 100, comprises a multiplicity of battery cells 10 and a charging and isolating device 12, which comprises an isolator switch 14, a charging switch 16 and a charging resistor 18. In addition, the battery system 100 comprises an isolating device 20 having an isolator switch 22.

For safe operation of the battery system 100, it is absolutely necessary for each battery cell 10 to be operated within a permitted operating range (voltage range, temperature range, current limits). If a battery cell 10 is outside these limits, it must be removed from the cell network. When the battery cells 10 are connected in series (as shown in FIG. 1), failure of a single battery cell 10 therefore results in failure of the whole battery system 100.

In particular in hybrid and electric vehicles, batteries using lithium-ion or nickel-metal hydride technology which have a large number of electrochemical battery cells connected in series are used. A battery management unit is used for monitoring the battery and is intended to ensure not only safety monitoring but also the longest possible life. For this purpose, the voltage of each individual battery cell is measured together with the battery current and the battery temperature and a state estimation (for example of the state of charge or of the state of aging of the battery) is made. The evaluated data are passed on to actuators which can act on the cells in a corrective manner (for example by charge balancing or temperature correction). At the same time, the battery management unit provides the user with up-to-date information in respect of the state of the battery. In order to maximize the life, it is helpful always to know the present maximum capacity of the battery, that is to say the maximum electrical power which can be output or drawn. If this capacity is exceeded, the aging of the battery can be markedly accelerated.

SUMMARY

The disclosure provides a battery system having a multiplicity of battery cells and a battery management unit. The battery system is preferably a lithium-ion battery system.

The battery management unit comprises a multiplicity of acquisition devices and a multiplicity of monitoring devices. A multiplicity of battery cells is assigned in each case to each of the acquisition devices. Each of the acquisition devices is designed to acquire at least one operating parameter of the battery cells assigned to it. A multiplicity of battery cells is likewise assigned in each case to each of the monitoring devices. Each of the monitoring devices is designed to monitor the operating parameter of the battery cells assigned to it The battery cells which are assigned in each case to one of the monitoring devices are assigned to at least two acquisition devices. This assignment rule means that the monitoring of the battery cells is optimized and thus the availability of the battery system is improved. This occurs by virtue of the fact that, in the event of a fault occurring in one of the acquisition units, although said faulty acquisition unit cannot determine any operating parameters of individual cells anymore, information relating to the absent measurement data can be obtained through at least one of the monitoring devices assigned in an interlaced manner. In abstracted form, the aim of the disclosure is that the monitoring units do not have the same system limits assigned to them as are assigned to the acquisition units, as a result of which a more precise estimation of the operating parameters by the monitoring units, and thus a greater reliability and safety of the overall system, can be achieved.

A preferred embodiment of the disclosure provides that at least one of the acquisition devices is designed to acquire the operating parameter for each individual one of the battery cells assigned to it. Here, this can be, in particular, an individual voltage present across each individual one of the battery cells. It is further preferred that at least one of the monitoring devices is designed to determine a sum of the values of the operating parameter of all of the battery cells assigned to said monitoring device. Here, this can be, in particular, a total voltage present across the entirety of the battery cells assigned to said monitoring device.

A particularly symmetrical distribution or assignment of the battery cells is achieved by virtue of an even number of battery cells being assigned in each case to at least some of the acquisition devices. In so doing, in each case half of the battery cells of an acquisition device are now assigned to precisely one of the monitoring devices. In addition, it is provided in a practical manner that the multiplicity of battery cells is grouped into a multiplicity of battery modules. Here, the battery cells of in each case one battery module can be assigned to each of the acquisition devices.

Cross-system monitoring can be achieved by virtue of those battery cells which are assigned to two or more acquisition devices being assigned to at least some of the monitoring devices.

Usually, the same number of battery cells is assigned to at least some of the acquisition devices. This applies in a similar manner in the case of the monitoring devices.

Finally, the acquisition devices can be components of a fieldbus system to which the monitoring devices can also optionally be connected.

While it is not necessary for the battery system according to the disclosure to have a compact form, a further aspect of the disclosure relates to a battery having a multiplicity of battery cells and a battery management unit which has the above-described technical features of the battery system according to the disclosure as a compact device.

Another aspect of the disclosure relates to a motor vehicle which comprises the battery system according to the disclosure.

As the whole, the use of the acquisition devices and monitoring devices achieves a provision of battery systems which can continue to be operated in a safe manner in the event of failure of one or more battery cells. Admittedly the battery system then has a restricted capacity at the terminals thereof in certain circumstances as compared to regular operation, although, with suitable configuration of the battery system, a failure of the system or a safety-critical state of the battery system can be avoided.

BRIEF DESCRIPTION OF THE DRAWINGS

Exemplary embodiments of the disclosure are explained in more detail with reference to the drawings and the following description. In the figures.

DETAILED DESCRIPTION

Figure 1:
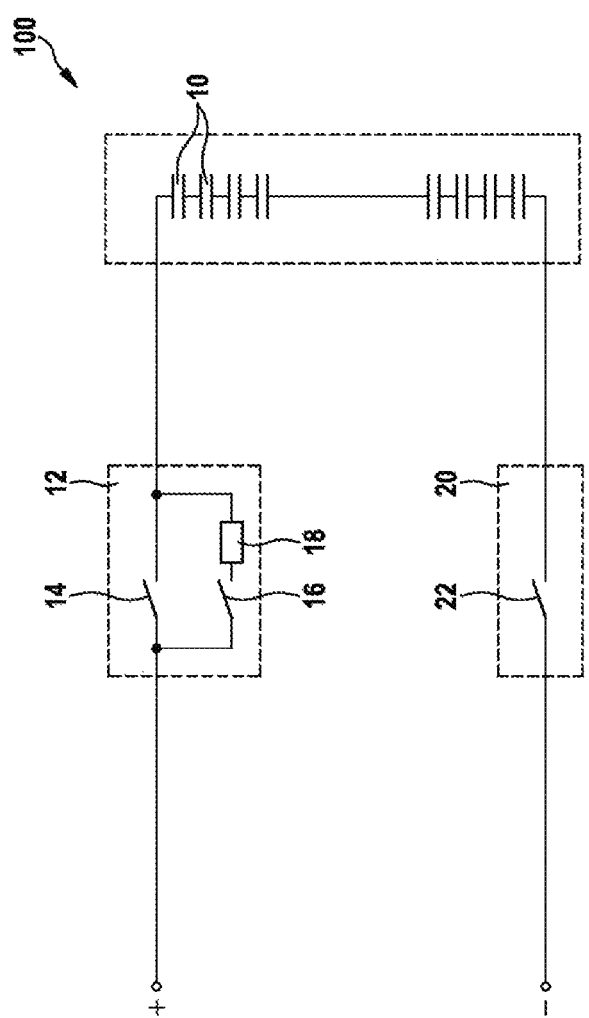
FIG. 1 shows a battery system according to the prior art.
Figure 2:
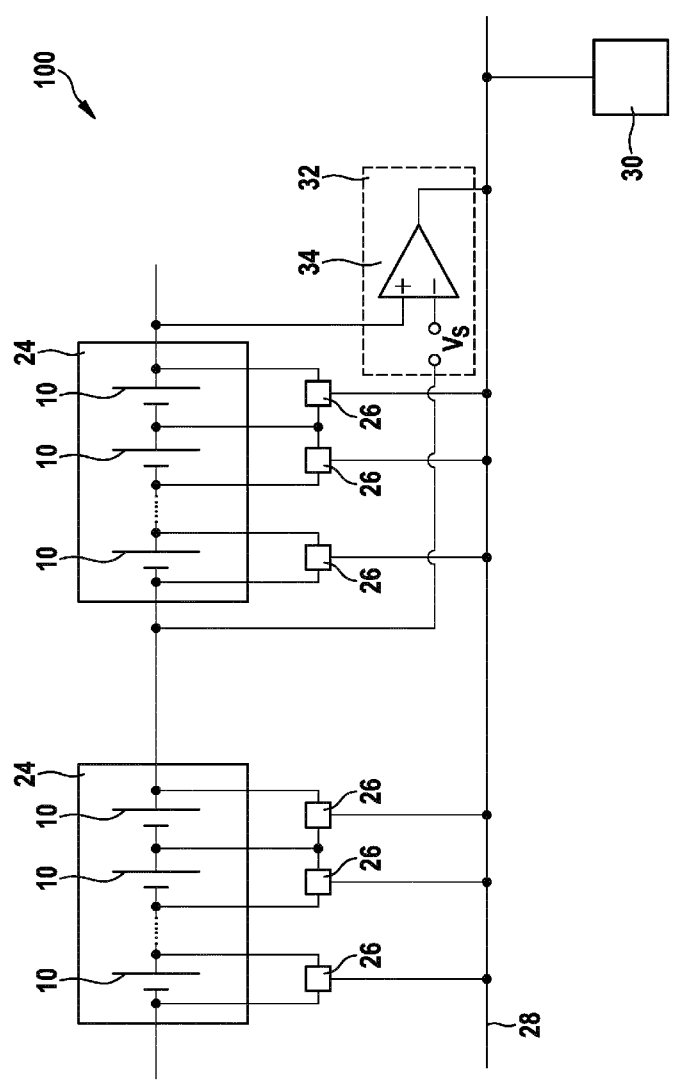
FIG. 2 shows a battery system comprising a multiplicity of acquisition devices.

FIG. 2 shows a battery system 100 in which a multiplicity of battery cells 10 is connected in series and is grouped into a multiplicity of modules 24. A module 24 comprises a predetermined number of, typically between six and twelve, battery cells 10. Acquisition devices 26 measure the voltage in each case across battery cell 10 and transfer the measured voltage values to a fieldbus 28 to which an evaluation unit 30 is connected. The evaluation unit 30 can actuate a high-voltage contactor to protect the battery system 100. The fieldbus system 28 in FIG. 2 is interconnected using a bus topology and makes use of a CAN (controlled area network) protocol.

In addition, a multiplicity of monitoring devices 32 (of which only one is illustrated in FIG. 2) is connected to the fieldbus 28. The monitoring devices 32 comprise in each case a comparator 34 which compares a voltage present across a module 24 with a predetermined voltage threshold value $V_s$.

If the measured voltage across the module 24 exceeds the voltage threshold value $V_s$, an alarm signal is transmitted to the fieldbus 28. In addition, a signal can be transmitted to the fieldbus 28 if a predetermined further voltage threshold value is undershot.

All of the monitoring devices 32 of the battery system 100 can be linked with a logic OR gate, which triggers an overall alarm as soon as one of the monitoring devices 32 triggers an alarm.

Figure 3:
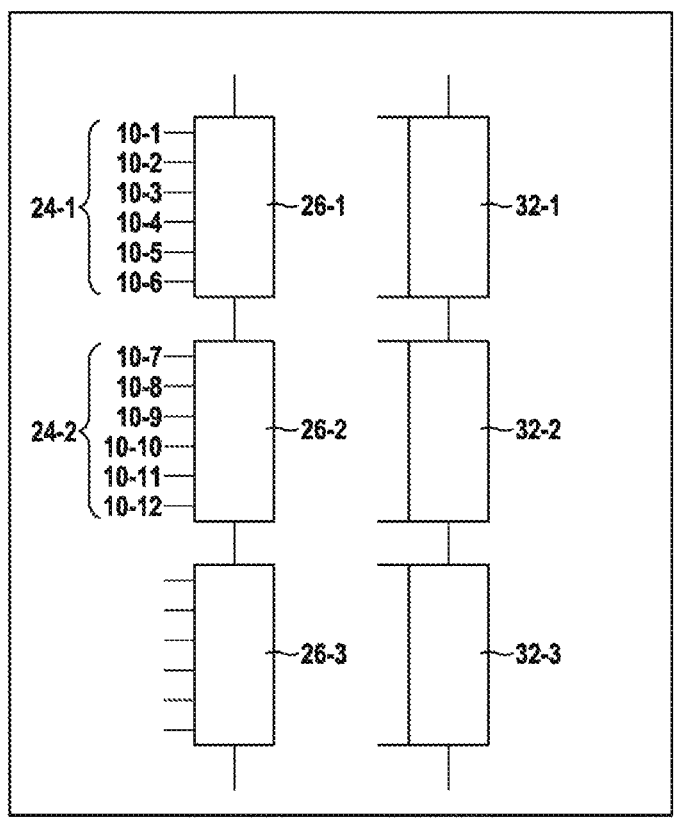
FIG. 3 shows an assignment of acquisition and monitoring devices with respect to a multiplicity of battery cells according to the prior art.

FIG. 3 shows an assignment of acquisition and monitoring devices with respect to a multiplicity of battery cells, as is known from the prior art. The multiplicity of battery cells 10-1, . . . , 10-12 is grouped into a multiplicity of battery modules 24-1, 24-2. In contrast to the arrangement illustrated in FIG. 2, the acquisition devices 26-1, 26-2 are assigned to the battery cells 10 of in each case one battery module 24-1, 24-2. More precisely, by way of example, the acquisition device 26-1 is assigned to the six battery cells 10-1, . . . , 10-6 and is designed to acquire the individual voltage present across each individual one of the battery cells 10-1, . . . , 10-6 assigned to said acquisition device. The acquisition device 26-1 is thus able to acquire six individual voltages. Each of the monitoring devices 32-1, 32-2, 32-3 is likewise assigned to precisely the battery cells 10 of in each case one battery module 24-1, 24-2, 24-3 and thus has the same system limits as the acquisition devices 26-1, 26-2, 26-3. Each of the monitoring devices 32-1, 32-2, 32-3 is designed to determine the total voltage which is present in each case across the battery module 24-1, 24-2, 24-3 assigned to said monitoring device. The result of this is that, in the event of a failure of one of the acquisition devices 26-1 26-2, 26-3, only the total voltage of that battery module in which the technical failure occurs can be determined. Information relating to the individual voltages in said module cannot be obtained, since there is a one-to-one assignment between acquisition devices 26-1, 26-2, 26-3 and monitoring devices 32-1, 32-2, 32-3.

Figure 4:
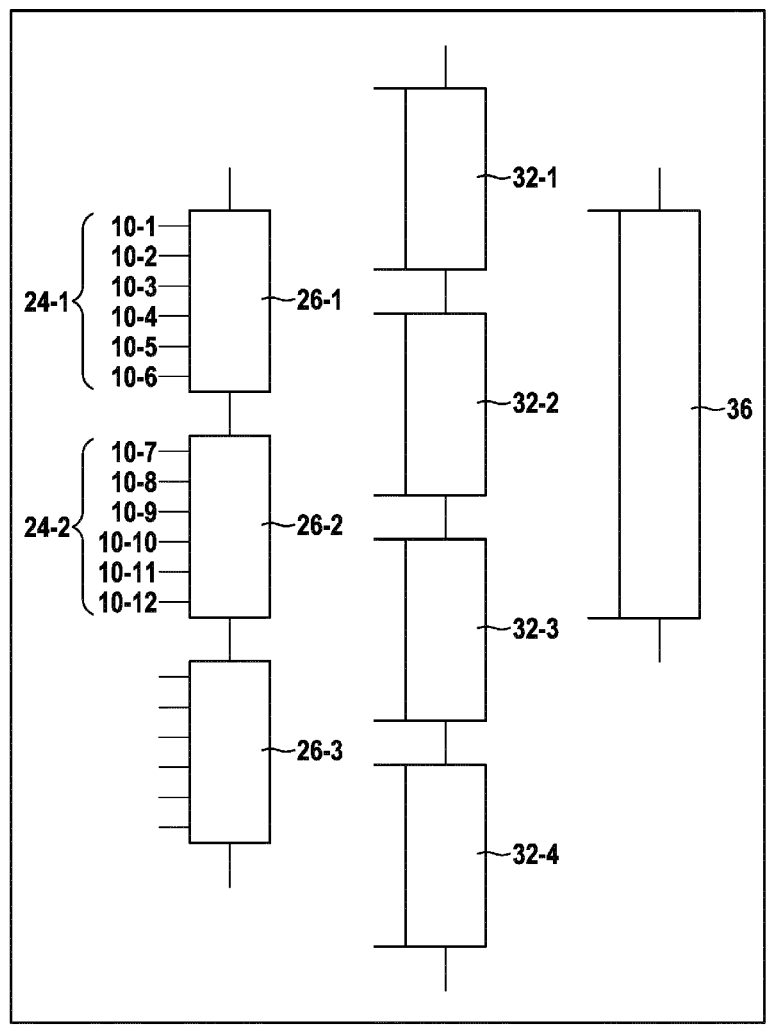
FIG. 4 shows an assignment of acquisition and monitoring devices with respect to a multiplicity of battery cells according to an embodiment of the disclosure.

For this reason, the disclosure provides an improved assignment of acquisition devices and monitoring devices in respect of a multiplicity of battery cells, as illustrated in FIG. 4. The monitoring devices 32,1, . . . , 32-4 are arranged in an interlaced manner with respect to the acquisition devices 26-1, 26-2, 26-3, with the result that they no longer have the same system limits. More precisely, each of the monitoring devices 32 is assigned in each case to half of a battery module and to a further half of an adjacent battery module. By way of example, the monitoring device 32-2 is assigned to the battery cells 10-4, . . . , 10-9 which in turn are assigned to the battery modules 24-1 and 24-2 and the acquisition devices 26-1 and 26-2. In the event of a failure of the acquisition device 26-2, information relating to the individual voltages across the individual battery cells 10-7, . . . , 10-12 can be provided by the measured values or other information which originates from the monitoring devices 32-2.

A further monitoring device 36 which is assigned to the battery cells 10-1, . . . , 10-12 of two battery modules 24-1, 24-2 is provided. If a multiplicity of monitoring devices 32-1, . . . , 32-4, 36 which provide information in each case for different groups of battery cells 10 is now provided, then information relating to the individual cells 10 can be collected by means of a control device—not shown.

The invention claimed is:
1. A battery system comprising:
a plurality of battery cells; and
a battery management unit comprising:
   a plurality of acquisition devices, each acquisition device being configured to measure individual battery cell voltages of at least two associated battery cells of the plurality of battery cells; and
   a plurality of monitoring devices, each monitoring device being configured to measure a total voltage of at least two associated battery cells of the plurality of battery cells,
   wherein the at least two battery cells associated with each monitoring device includes at least one battery cell associated with a different acquisition device than other battery cells of the at least two battery cells associated with the respective monitoring device,
   wherein the at least two battery cells associated with each acquisition device includes at least one battery cell associated with a different monitoring device than other battery cells of the at least two battery cells associated with the respective acquisition device.

2. The battery system as claimed in claim 1, wherein the battery cells are connected in series.

3. The battery system as claimed in claim 1, wherein:
each acquisition device is configured to measure individual battery cell voltages of an even number of associated battery cells of the plurality of battery cells; and
half of the even number of battery cells associated with each acquisition device is associated with a different monitoring device than another half of the even number of battery cells associated with the respective acquisition device.

4. The battery system as claimed in claim 1, wherein:
the plurality of battery cells is grouped into a plurality of battery modules that each include at least two battery cells of the plurality of battery cells, and
each acquisition device is configured to measure individual battery cell voltages of each battery cell of a respective battery module.

5. The battery system as claimed in claim 1, wherein at least one of:
each acquisition device is configured to measure individual battery cell voltages of a same number of associated battery cells; and
each monitoring device is configured to measure total voltages of a same number of associated battery cells.

6. The battery system as claimed in claim 1, further comprising:
an evaluation unit; and
a bus connected to the evaluation unit,
wherein each acquisition device is connected to the bus and configured to communicate with the evaluation unit via the bus,
wherein each monitoring device is connected to the bus and configured to communicate with the evaluation unit via the bus.

7. A battery comprising:
a plurality of battery cells; and
a battery management unit comprising:
a plurality of acquisition devices, each acquisition device being configured to measure individual battery cell voltages of at least two associated battery cells of the plurality of battery cells; and
a plurality of monitoring devices, each monitoring device being configured to measure a total voltage of at least two associated battery cells of the plurality of battery cells,
wherein the at least two battery cells associated with each monitoring device includes at least one battery cell associated with a different acquisition device than other battery cells of the at least two battery cells associated with the respective monitoring device,
wherein the at least two battery cells associated with each acquisition device includes at least one battery cell associated with a different monitoring device than other battery cells of the at least two battery cells associated with the respective acquisition device,
wherein the battery forms a battery system.

8. A motor vehicle comprising:
a drive system; and
a battery system connected to the drive system, the battery system comprising:
a plurality of battery cells and
a battery management unit comprising:
a plurality of acquisition devices, each acquisition device being configured to measure individual battery cell voltages of at least two associated battery cells of the plurality of battery cells; and
a plurality of monitoring devices, each monitoring device being configured to measure a total voltage of at least two associated battery cells of the plurality of battery cells,
wherein the at least two battery cells associated with each monitoring device includes at least one battery cell associated with a different acquisition device than other battery cells of the at least two battery cells associated with the respective monitoring device,
wherein the at least two battery cells associated with each acquisition device includes at least one battery cell associated with a different monitoring device than other battery cells of the at least two battery cells associated with the respective acquisition device.

* * * * *